(12) United States Patent
Kerber et al.

(10) Patent No.: US 8,551,848 B2
(45) Date of Patent: Oct. 8, 2013

(54) FIELD EFFECT TRANSISTOR WITH ASYMMETRIC ABRUPT JUNCTION IMPLANT

(71) Applicant: International Business Machines Corporation, Armonk, NY (US)

(72) Inventors: Pranita Kerber, Albany, NY (US); Kangguo Cheng, Schenectady, NY (US); Bruce B. Doris, Brewster, NY (US); Ali Khakifirooz, Mountain View, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/682,108

(22) Filed: Nov. 20, 2012

(65) Prior Publication Data

US 2013/0078781 A1    Mar. 28, 2013

Related U.S. Application Data

(62) Division of application No. 12/816,697, filed on Jun. 16, 2010, now Pat. No. 8,362,560.

(51) Int. Cl.
*H01L 21/336* (2006.01)

(52) U.S. Cl.
USPC ............................ 438/303; 438/300; 257/350

(58) Field of Classification Search
USPC .................................. 257/350; 438/300, 303
See application file for complete search history.

(56) References Cited

U.S. PATENT DOCUMENTS

| | | | |
|---|---|---|---|
| 6,534,373 B1 * | 3/2003 | Yu | ................................. 438/372 |
| 6,682,980 B2 | 1/2004 | Chidambaram et al. | |
| 7,049,153 B2 | 5/2006 | Agarwal et al. | |
| 2009/0090982 A1 | 4/2009 | Ranade et al. | |
| 2009/0294872 A1 | 12/2009 | Chen et al. | |

* cited by examiner

*Primary Examiner* — Julio J Maldonado
*Assistant Examiner* — Robert Bachner
(74) *Attorney, Agent, or Firm* — Howard M. Cohn; Katherine S. Brown

(57) ABSTRACT

Embodiments of the present invention provide the ability to fabricate devices having similar physical dimensions, yet with different operating characteristics due to the different effective channel lengths. The effective channel length is controlled by forming an abrupt junction at the boundary of the gate and at least one source or drain. The abrupt junction impacts the diffusion during an anneal process, which in turn controls the effective channel length, allowing physically similar devices on the same chip to have different operating characteristics.

6 Claims, 6 Drawing Sheets

FIELD EFFECT TRANSISTOR WITH ASYMMETRIC ABRUPT JUNCTION IMPLANT

CROSS REFERENCE TO RELATED APPLICATIONS

This application is a division of commonly-owned, copending U.S. patent application Ser. No. 12/816,697 entitled SEMICONDUCTOR FABRICATION and filed on Jun. 16, 2010.

FIELD OF THE INVENTION

The present invention relates generally to a semiconductor fabrication, and more specifically to the fabrication of transistors.

BACKGROUND OF THE INVENTION

There is an ever-present desire in the semiconductor fabrication industry to achieve individual devices with smaller physical dimensions. Reducing the dimensions of devices is referred to as scaling. Scaling is desirable in order to increase the number of individual devices that can be placed on a given area of semiconductor material and the process yield and to reduce the unit cost and the power consumption of individual devices. In addition, scaling can result in performance increases of the individual devices as the charge carriers, having a finite velocity, have a shorter distance to travel and less bulk material has to accumulate or dissipate charges. Thus, the trend in the industry is towards thinner device regions and gate oxides, shorter channels, and lower power consumption.

However, scaling often creates some performance drawbacks. In particular, a known category of performance limitations known as short channel effects arises as the length of the channel of CMOS devices is reduced by scaling. One particular short-channel effect in CMOS devices, known as Drain Induced Barrier Lowering (DIBL), is significantly responsible for the degradation of sub-threshold swing in deep submicron devices. DIBL is a reduction in the potential barrier between the drain and source as the channel length shortens. When the drain voltage is increased, the depletion region around the drain increases and the drain region electric field reduces the channel potential barrier which results in an increased off-state or leakage current between the source and drain. This can cause increased power consumption, which is an issue of particular importance in portable, battery powered devices.

A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa.

For example, a CMOS inverter is a series connected PFET and NFET pair that are connected between a power supply voltage ($V_{dd}$) and ground (GND). Both are gated by the same input and both drive the same output, the PFET pulling the output high and the NFET pulling the output low at opposite input signal states. Ideally, when the gate of a NFET is below some positive threshold voltage ($V_t$) with respect to its source, the NFET is off, i.e., an open switch. Above $V_t$, the NFET is on conducting current, i.e., the switch is closed. Similarly, a PFET is off when its gate is above its $V_t$, i.e., less negative, and on below $V_t$. Hence, for a particular integrated circuit design, so called "short channel" parameters such as Vt, DIBL, and Ioff are important factors to consider. Therefore, it is desirable to have a semiconductor device with improved ability to specify short channel parameters.

SUMMARY

In one embodiment of the present invention, a semiconductor structure is provided, comprising a substrate; a gate disposed on the substrate; at least one source disposed on the substrate adjacent to the gate; at least one drain disposed on the substrate adjacent to the gate; and wherein an abrupt junction is formed at the intersection of the gate and at least one of the sources or drains.

In another embodiment, a method of fabricating a transistor is provided, comprises: performing an abrupt junction implant; performing an anneal; forming a plurality of silicide regions, wherein a silicide region is formed on the gate, and on each source, and on each drain of the transistor.

In another embodiment, the present invention provides an integrated circuit comprising: a first transistor; a second transistor having substantially the same physical dimensions, and wherein first transistor has a first effective channel length, and the second transistor has a second effective channel length, wherein the first effective channel length is less than the second effective channel length.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Block diagrams may not illustrate certain connections that are not critical to the implementation or operation of the present invention, for illustrative clarity.

Figure 1:
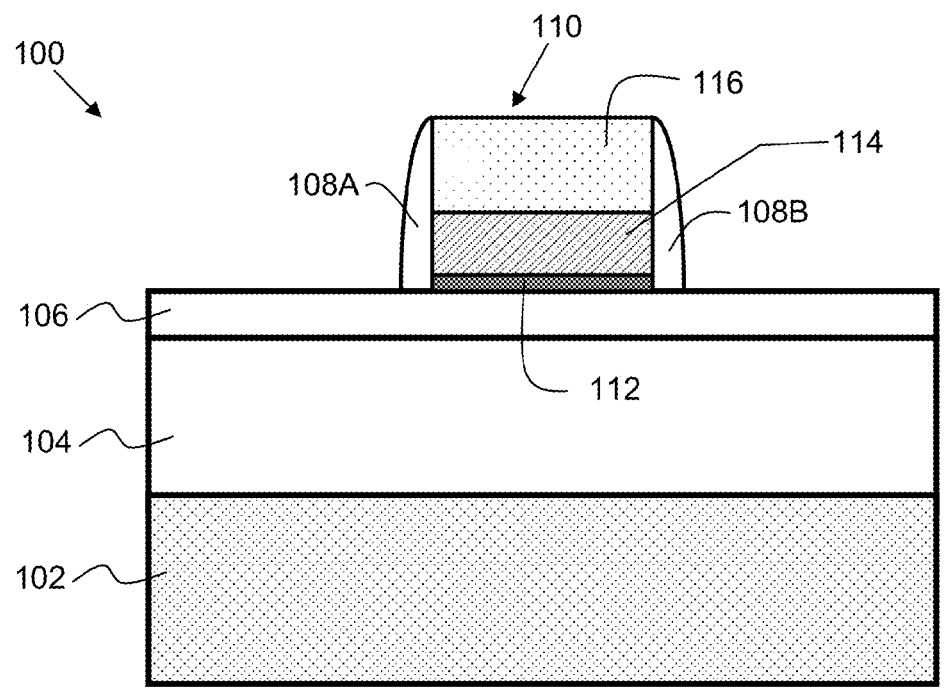

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit(s) being the number of the drawing figure (FIG).

FIGS. 1-6 show process steps in accordance with an embodiment of the present invention.

Figure 7:
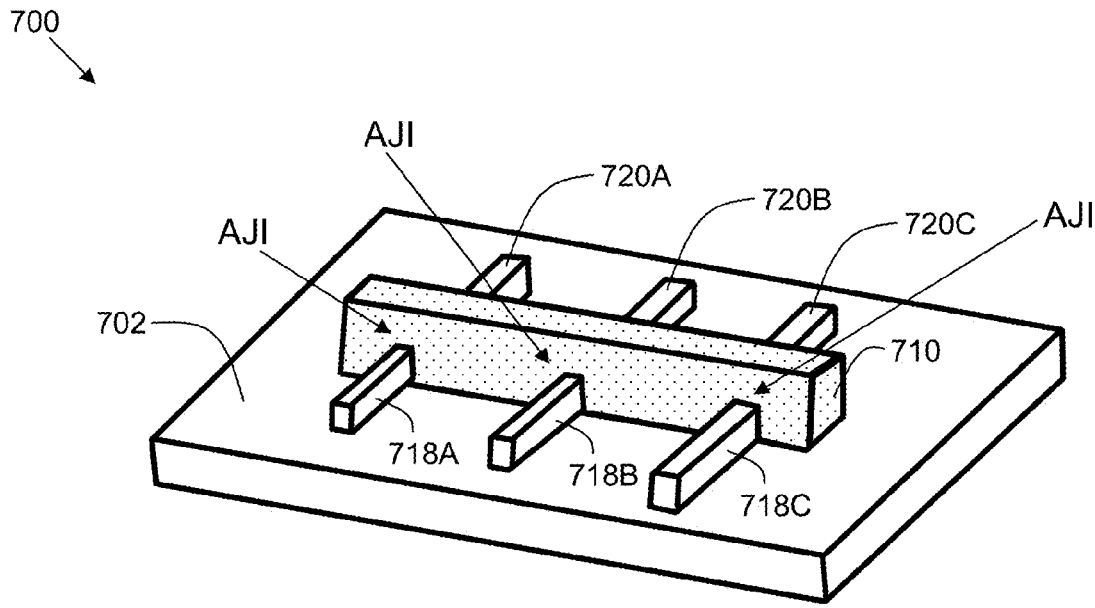

FIG. 7 shows an alternative embodiment of the present invention.

Figure 8:
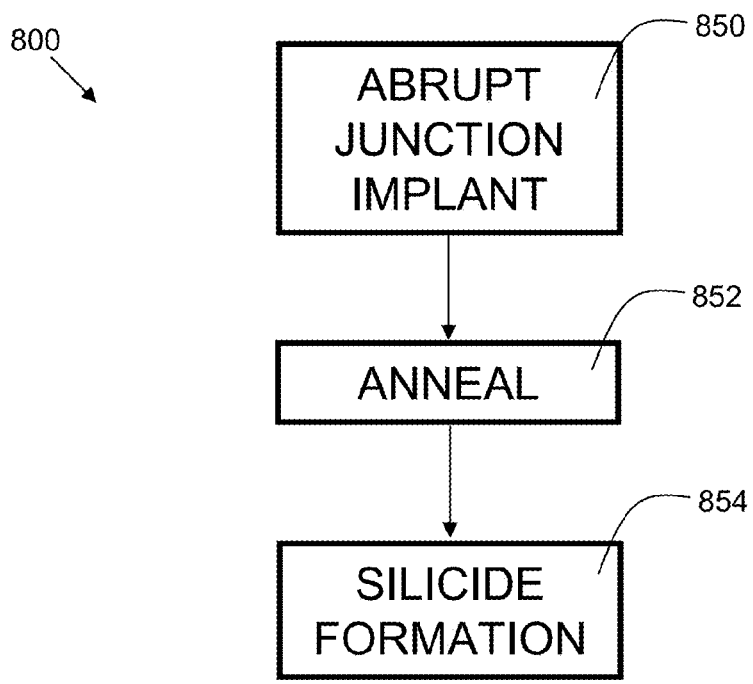

FIG. 8 is a flowchart indicating process steps for a method in accordance with an embodiment of the present invention.

Figure 9:
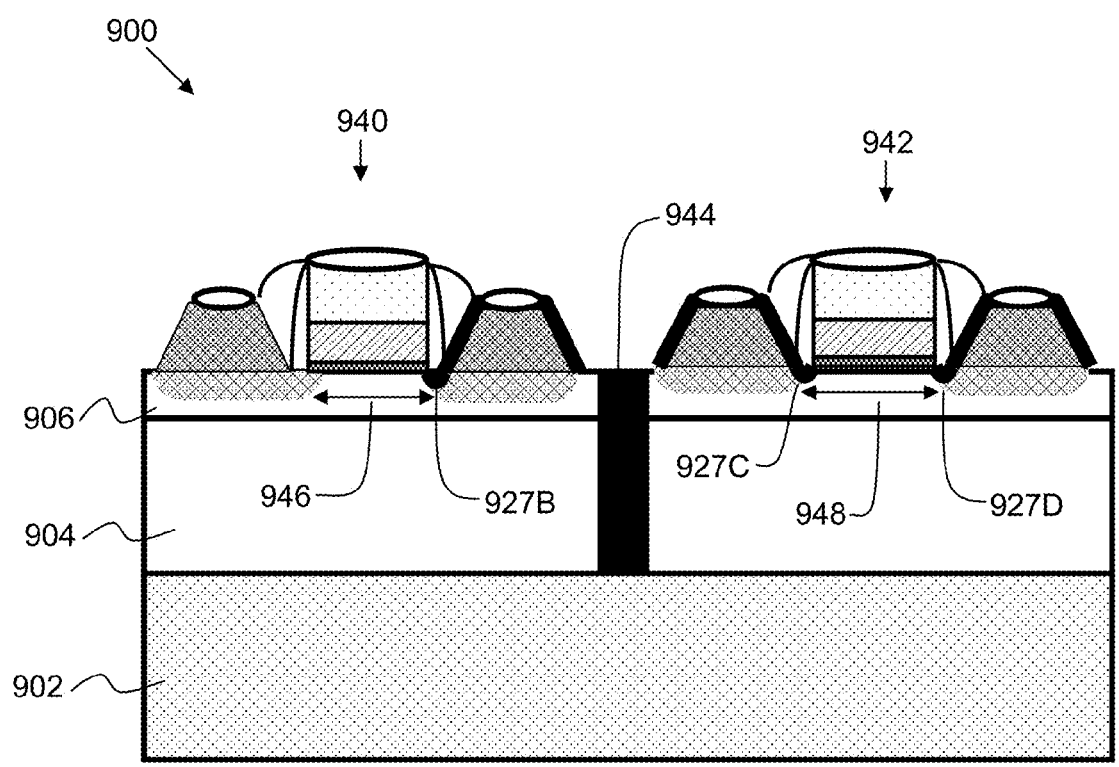

FIG. 9 shows an alternative embodiment of the present invention.

Figure 10:
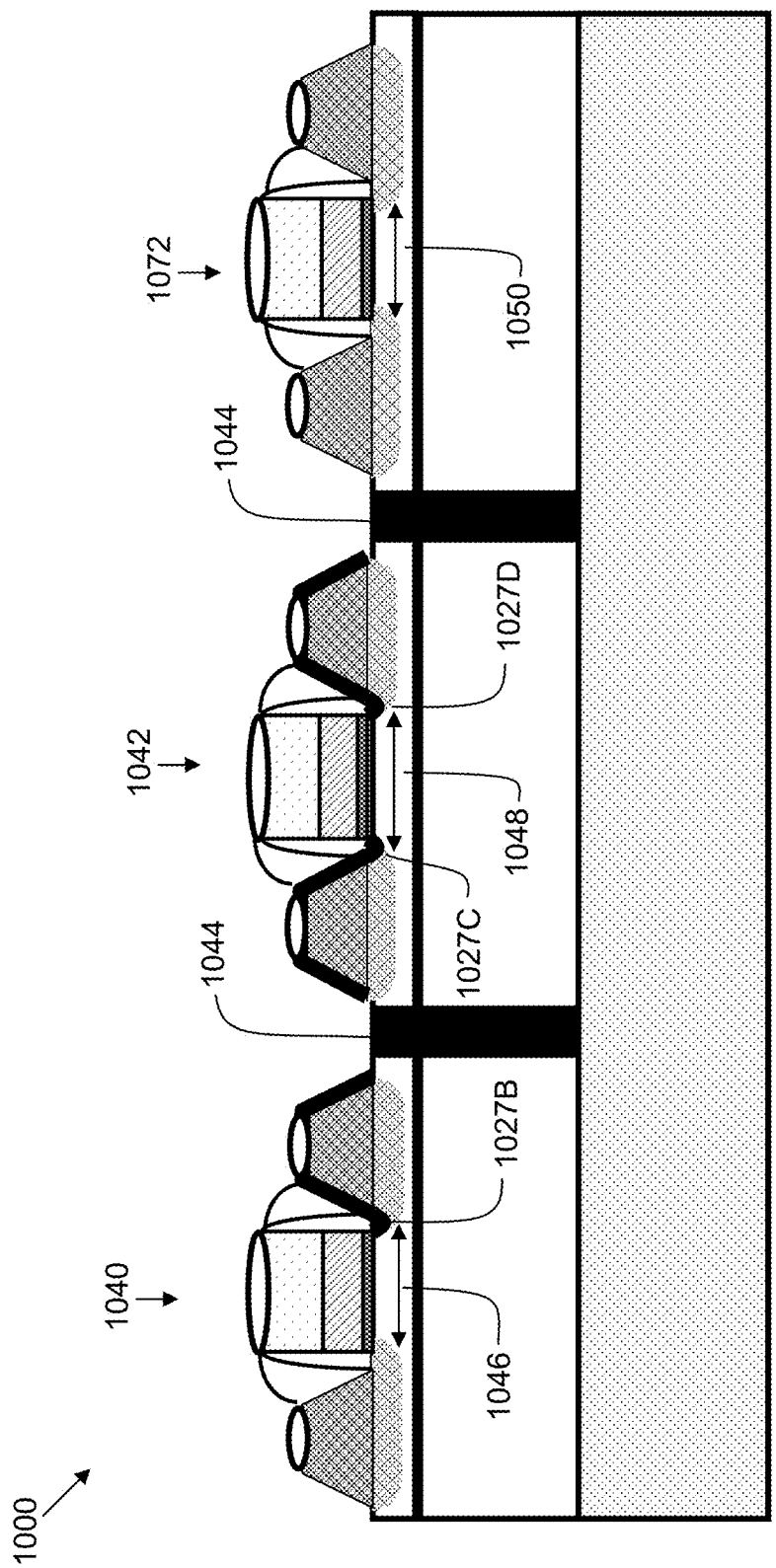

FIG. 10 shows another alternative embodiment of the present invention.

DETAILED DESCRIPTION

FIG. 1 shows a prior art semiconductor structure 100 which will be briefly described here to provide background for the starting point for embodiments of the present invention. Semiconductor structure 100 is a FET (field effect transistor) which comprises a silicon substrate 102, with a buried oxide layer 104 disposed on the substrate 102. An extremely thin silicon-on-insulator (ETSOI) layer 106 is disposed on the buried oxide layer 104. The ETSOI layer 106 may typically be in the range 2 to 10 nanometers. Disposed on ETSOI layer 106 is a gate stack 110. Gate stack 110 comprises single or multilayer gate dielectric 112, metal layer(s) 114, and/or polysilicon layer 114. Spacers 108A and 108B, typically comprising nitride and/or oxide layers, are disposed adjacent to the gate stack 110.

Figure 2:
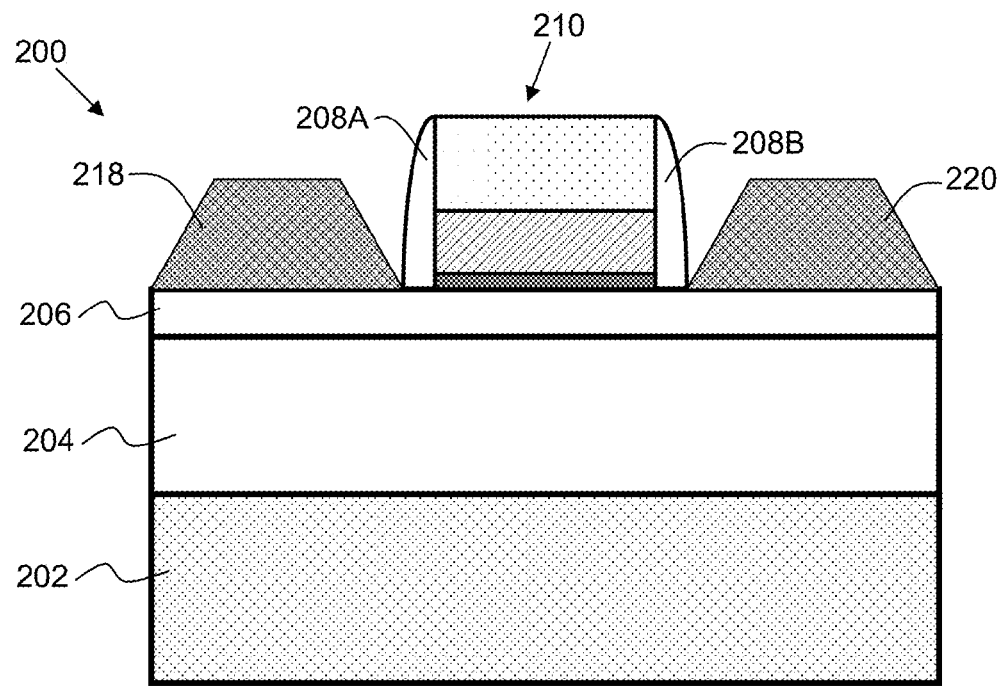

FIG. 2 shows an additional prior art semiconductor structure 200 which will be briefly described here to provide background for the starting point for embodiments of the present invention. As stated previously in this disclosure, similar elements may be referred to by similar numbers in various figures (FIGs) of the drawing, in which case typically the last two significant digits may be the same. For example, buried oxide layer 104 of FIG. 1 is similar to buried oxide layer 204 of FIG. 2. Structure 200 is referred to as an RSD (raised source and drain) structure, since it has a raised source 218 and raised drain 220.

Figure 3:
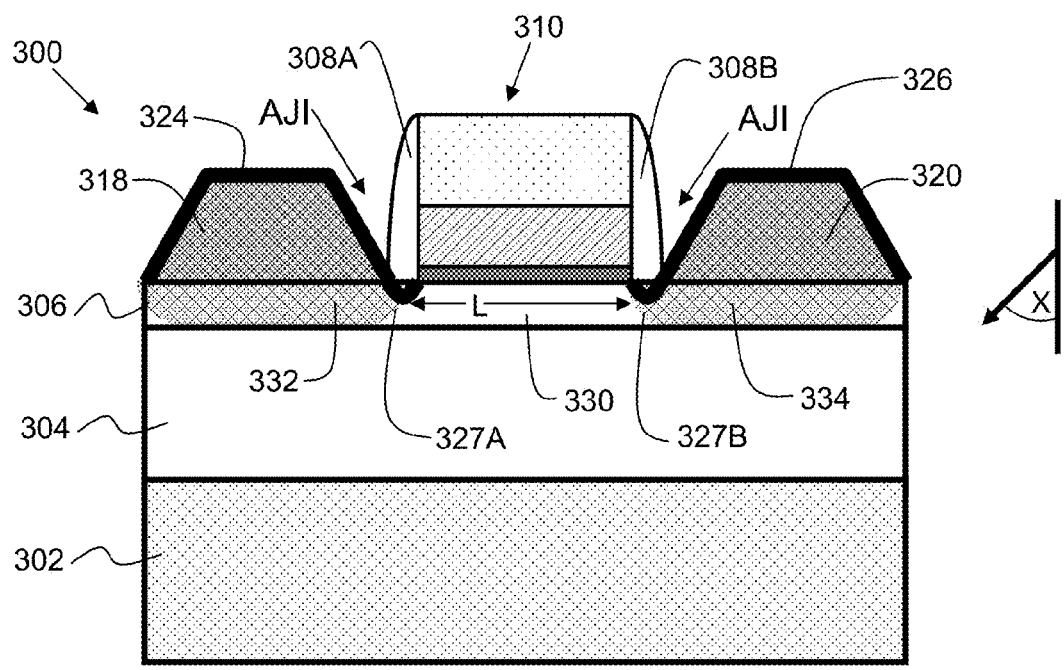

FIG. 3 shows a semiconductor structure 300 at a subsequent intermediate processing step. In this processing step, an abrupt junction implant (AJI) is applied to the structure, creating damage areas 324 and 326. In one embodiment, the abrupt junction implant is a preamorphization implant (PAI) performed at an angle X, which can range from about 5 degrees to about 25 degrees deviation from vertical. PAI damages the silicon to make it "non-crystalline." The non-crystalline silicon minimizes channeling, which is the term used for an ion trajectory following an open path, when the wafer is not oriented correctly. Note that the term "damage" in this sense refers to the changing of the silicon structure from crystalline to non-crystalline, which is desirable in this case.

In other embodiments, AJI is not a PAI implant. Any implant species that alters the defect concentration of the crystalline silicon and in effect leads to an abrupt junction for the active dopants after annealing may serve as a AJI implant. Examples include C, N or F implants which alter the interstitial and vacancy concentration but do no amorphize the crystalline silicon when implanted. These species, when present could alter the active junction profile and render an abrupt junction.

After the AJI is performed, the semiconductor structure 300 undergoes an anneal, such as a spike anneal, where it is heated for up to a few seconds and then cooled at a similar rate. In one embodiment, the spike anneal temperature ranges from about 900 degrees Centigrade to about 1100 degrees Centigrade. The spike anneal forms the abrupt junction 327A at the intersection of the intersection of the gate stack 310 and the source 318, and also forms abrupt junction 327B at the intersection of the gate stack 310 and the drain 320. An abrupt junction is where the change of the doping concentration is very steep. For the purposes of this disclosure, an abrupt junction is one that is less than 3 nanometers per decade, meaning that the concentration changes by a factor of 10 within 3 nanometers. In this case, the diffusion of dopants from raised source 318 diffuses into diffusion region 332, but the damage 324 caused by the AJI causes the diffusion to drop sharply at the boundary to the channel 330. Besides a spike anneal, other annealing technique can also be used, such as laser anneal, flash anneal, and rapid thermal anneal.

In embodiments of the present invention, the location of the abrupt junction can be controlled by the location and amount of damage induced by the AJI. The location of the abrupt junctions 327A and 327B determine the effective length L of channel 330. The length L controls various device performance parameters, including so-called "short channel parameters" such as Vt (Threshold Voltage), DIBL (Drain Induced Barrier Lowering), and Ioff (off-state leakage current).

Figure 4:
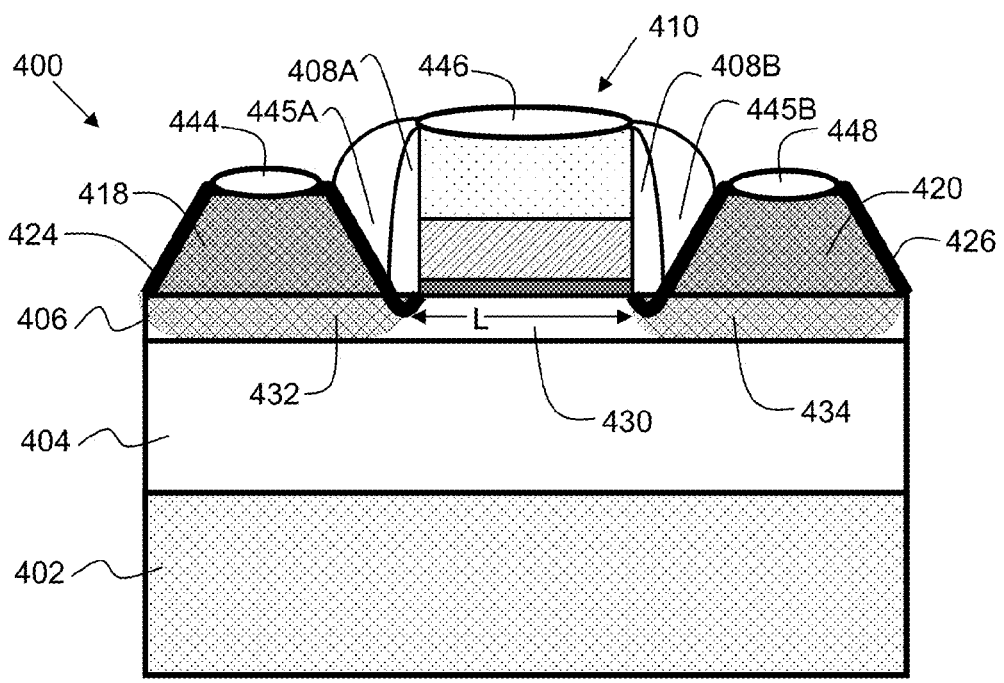

FIG. 4 shows a semiconductor structure 400 at a subsequent intermediate processing step. In this processing step, silicide regions 444, 446, and 448 are formed on source 418, gate stack 410 and drain 420, respectively. In one embodiment, spacers 445A and 445B are formed by deposition followed by directional etch (e.g., reactive ion etch (RIE)). The silicide regions 444, 446, and 448 are formed via salicide process which is well known in the art. The silicide regions provide a way for the semiconductor structure 400 to be connected to other circuit elements (transistors, diodes, capacitors, etc.) within an integrated circuit (IC).

Figure 5:
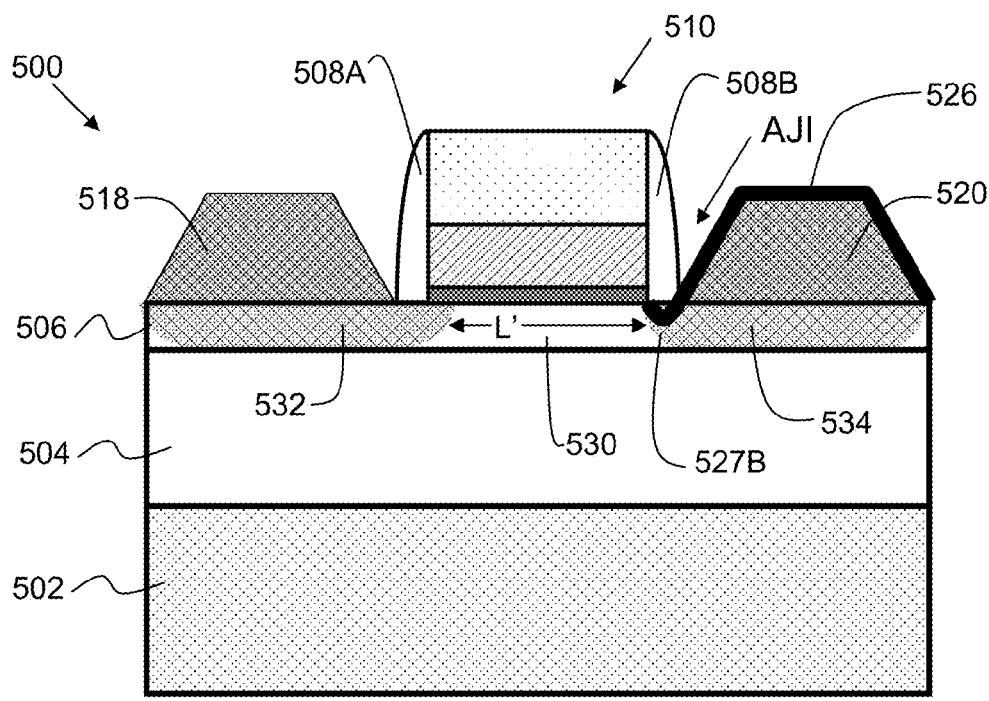

FIG. 5 shows a semiconductor structure 500 at a subsequent intermediate processing step of an alternative embodiment using asymmetric AJI. In this processing step, the abrupt junction implant is applied asymmetrically, in that an AJI is performed only on one of the source/drain areas. In this FIG. the AJI is applied to drain 520, but an asymmetric AJI may also be performed on the source 518 instead of drain 520. Because the source 518 does not receive the AJI implant, and therefore semiconductor structure has abrupt junction 527B, but does not have an abrupt junction on the source side (as compared to abrupt junction 327A of FIG. 3). Since there is no abrupt junction on the side of the source 518, there is increased diffusion into source region 532. This changes the effective length L' of channel 530, such that L' is less than L of FIG. 3.

Figure 6:
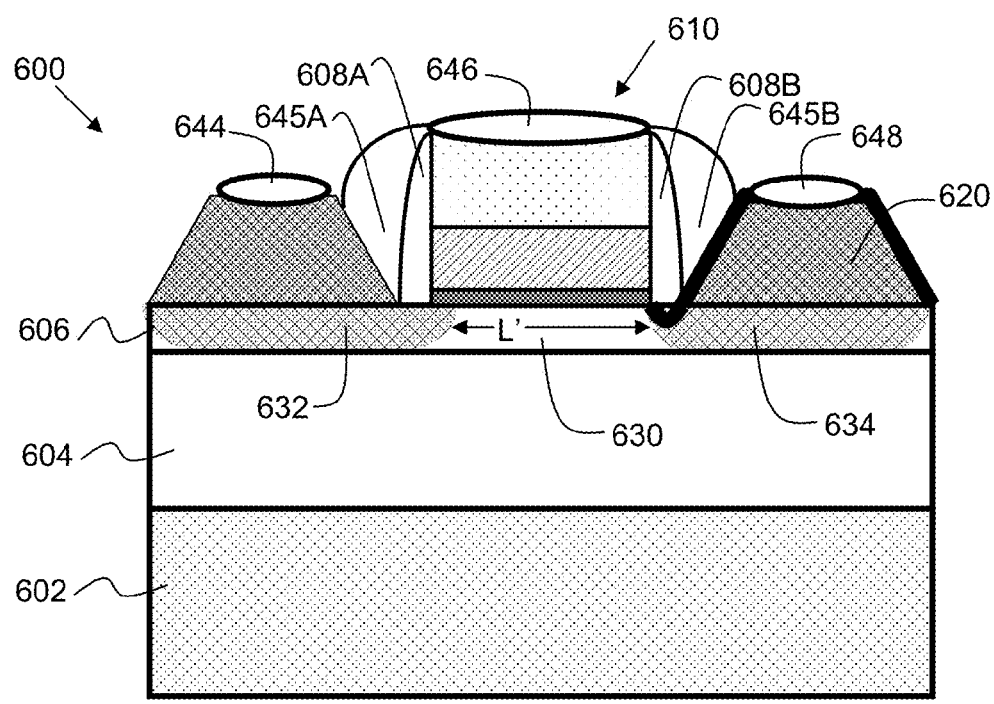

FIG. 6 shows a semiconductor structure 600 at a subsequent intermediate processing step. In this processing step, spacers 645A and 645B are formed by deposition followed by directional etch (e.g., reactive ion etch (RIE)). Silicide regions 644, 646, and 648 are formed on source 618, gate stack 610 and drain 620, respectively. Semiconductor structure 600 is an asymmetric abrupt junction device, as compared with semiconductor structure 400 of FIG. 4, which is a symmetrical abrupt junction device. As such, the effective channel length L' of FIG. 6 is different from effective channel length L of FIG. 4, and hence the two semiconductor structures, 400 and 600, while possibly residing on the same chip, can have different operating characteristics.

FIG. 7 shows a semiconductor structure 700 in accordance with an alternate embodiment of the present invention. Semiconductor structure 700 is a FinFET structure, comprising substrate 702, gate 710, and multiple sources (718A, 718B, 718C) and multiple drains (720A, 720B, and 720C). The AJI is applied to the sources and drains in a similar manner to what is disclosed previously for the raised source/drain structures. In this way, different FinFET devices within the same chip (die) can be fabricated having similar physical dimensions, yet having different operating characteristics. Similar to as described for the raised source/drain embodiment, semiconductor structure 700 may have an asymmetrical AJI, where the AJI is applied only to the sources (718A, 718B, 718C) or only to the drains (720A, 720B, and 720C). Similar to the case with the raised source/drain embodiment, the AJI creates the damage that allows formation of an abrupt junction as a result of a spike anneal.

FIG. 8 is a flowchart 800 indicating process steps for a method in accordance with an embodiment of the present invention. In process step 850, an abrupt junction implant is performed. In one embodiment, the abrupt junction implant is a preamorphization implant (PAI) performed at an angle X, which can range from about 5 degrees to about 25 degrees.

Alternatively, a co-implant with species that alters the interstitial and vacancy concentration of the crystalline silicon without amorphizing it can also be performed. The species for the abrupt junction implant may include, but is not limited to, Xe, Ge, Si, C, N, or F. The implant species may include a single element, or a combination of the aforementioned elements. In process step 852, an anneal is performed. In one embodiment, the anneal is a spike anneal having a temperature that ranges from about 900 degrees Centigrade to about 1100 degrees Centigrade. In process step 854, silicide is formed on the source, gate, and drain of the device.

FIG. 9 shows an additional embodiment of the present invention. Integrated circuit 900 comprises transistor 940, and transistor 942. Transistor 940 and transistor 942 are separated by shallow trench isolation area (STI) 944. Transistor 940 has an asymmetric abrupt junction 927B. Transistor 942 has symmetric abrupt junctions 927C and 927D. Transistors 940 and 942 are disposed on a substrate comprising a layer of silicon substrate 902, with a buried oxide layer 904 disposed on the substrate 902. An extremely thin silicon-on-insulator (ETSOI) layer 906 is disposed on the buried oxide layer 904. Transistor 940 has substantially the same physical dimensions as transistor 942. However, the effective channel length 946 of transistor 940 is less than the effective channel length 948 of transistor 942, due to the different abrupt junction applications (asymmetric versus symmetric). In one embodiment, the effective channel length 946 is at least 2 nanometers less than the effective channel length 948, thereby giving different operating parameters. For example threshold voltage parameter Vt for transistor 940 is different than the value of Vt for transistor 942, due to the differing effective channel lengths of the two transistors.

FIG. 10 shows an additional embodiment of the present invention. Integrated circuit 1000 comprises transistor 1040, transistor 1042, and transistor 1072. Transistors 1040, 1042, and 1072 are separated by shallow trench isolation areas (STI) 1044. Transistor 1040 is an asymmetric AJI transistor having effective channel length 1046. Transistor 1042 is a symmetric AJI transistor having effective channel length 1048. Transistor 1072 is a non-AJI transistor having effective channel length 1050. Therefore, AJI transistors 1040 and 1042 coexist with non-AJI transistor 1072 (having no AJI implant at all) on the same chip. In this case, the three transistors (symmetric AJI transistor 1042, asymmetric AJI transistor 1040, and non-AJI transistor 1072) have the same gate-stack but different operating characteristics because of different junctions, resulting in different effective channel lengths. That is, effective channel length 1046, effective channel length 1048 and effective channel length 1050 all have different values, though they reside on the same chip.

As can now be appreciated, embodiments of the present invention provide the ability to fabricate devices having similar physical dimensions, yet with different operating characteristics due to the different effective channel lengths. By applying the appropriate AJI, the effective channel length L can be controlled, allowing physically similar devices on the same chip to have different operating characteristics.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a transistor, the transistor comprising a gate, at least one source, and at least one drain, comprising:
performing an abrupt junction implant asymmetrically on either the at least one source or the at least one drain to form an abrupt junction of less than 3 nanometers per decade;
performing an anneal;
forming a plurality of silicide regions, wherein a silicide region is formed on the gate, and on each source, and on each drain.

2. The method of claim 1, wherein the step of performing an abrupt junction implant is performed at an angle ranging from about 5 degrees to about 45 degrees deviation from vertical.

3. The method of claim 1, wherein the step of performing an anneal comprises performing a spike anneal at a temperature ranging from about 900 degrees centigrade to about 1100 degrees centigrade.

4. The method of claim 1, wherein the step of performing an abrupt junction implant is performed using an element selected from the group consisting of Xenon, Germanium, Fluorine, Nitrogen, Silicon, and Carbon.

5. The method of claim 1, wherein the step of performing an abrupt junction implant is applied asymmetrically, wherein each source has an abrupt junction implant applied thereto, and wherein each drain does not have an abrupt junction implant applied thereto.

6. The method of claim 1, wherein the step of performing an abrupt junction implant is applied asymmetrically, wherein each drain has an abrupt junction implant applied thereto, and wherein each source does not have an abrupt junction implant applied thereto.

* * * * *